(12) United States Patent
Pettersson et al.

(10) Patent No.: US 9,157,143 B2
(45) Date of Patent: Oct. 13, 2015

(54) COATED CUTTING TOOL

(75) Inventors: Marie Pettersson, Alvsjo (SE); Andreas Hedin, Stockholm (SE); Axel Genvad, Bandhagen (SE); Ann-Britt Ljungberg, Stockholm (SE); Lars Gustafsson, Huddinge (SE); Roberth Ljunggren, Falköping (SE)

(73) Assignee: Sandvik Intellectual Property, Sandviken (SE)

( * ) Notice: Subject to any disclaimer, the term of this patent is extended or adjusted under 35 U.S.C. 154(b) by 173 days.

(21) Appl. No.: 13/702,509

(22) PCT Filed: May 31, 2011

(86) PCT No.: PCT/EP2011/058957
§ 371 (c)(1),
(2), (4) Date: Jan. 11, 2013

(87) PCT Pub. No.: WO2011/154291
PCT Pub. Date: Dec. 15, 2011

(65) Prior Publication Data
US 2013/0202896 A1 Aug. 8, 2013

Related U.S. Application Data

(60) Provisional application No. 61/352,546, filed on Jun. 8, 2010.

(30) Foreign Application Priority Data

Jun. 7, 2010 (EP) .................................... 10005853

(51) Int. Cl.
C23C 14/00 (2006.01)
B22F 7/06 (2006.01)
C22C 29/08 (2006.01)
C23C 14/06 (2006.01)
C23C 28/02 (2006.01)
C23C 28/04 (2006.01)
C23C 28/00 (2006.01)
C23C 30/00 (2006.01)
B22F 5/00 (2006.01)

(52) U.S. Cl.
CPC . *C23C 14/00* (2013.01); *B22F 7/06* (2013.01); *C22C 29/08* (2013.01); *C23C 14/0641* (2013.01); *C23C 28/023* (2013.01); *C23C 28/044* (2013.01); *C23C 28/42* (2013.01); *C23C 30/005* (2013.01); *B22F 2005/001* (2013.01)
USPC ............... 428/697; 51/307; 51/309; 428/469; 428/472; 428/698; 428/699

(58) Field of Classification Search
CPC .......... B22F 7/06; C22C 29/08; C23C 14/00; C23C 14/0641; C23C 28/023; C23C 28/044; C23C 28/42; C23C 30/005
USPC ............ 51/307, 309; 428/469, 472, 697, 698, 428/699
See application file for complete search history.

(56) References Cited

U.S. PATENT DOCUMENTS

| | | | | |
|---|---|---|---|---|
| 6,273,930 B1* | 8/2001 | Waldenstrom | | 75/240 |
| 7,220,480 B2* | 5/2007 | Jansson et al. | | 428/697 |
| 7,727,621 B2* | 6/2010 | Nordlof et al. | | 428/472 |
| 7,767,319 B2* | 8/2010 | Åkesson et al. | | 428/699 |
| 7,938,878 B2* | 5/2011 | Norgren et al. | | 75/240 |
| 8,043,729 B2 | 10/2011 | Sundstrom | | |
| 8,105,966 B2* | 1/2012 | Dahl et al. | | 501/96.4 |
| 8,283,058 B2* | 10/2012 | Martensson et al. | | 428/697 |
| 2006/0286410 A1* | 12/2006 | Ahlgren et al. | | 428/698 |
| 2008/0276544 A1* | 11/2008 | Hirose et al. | | 51/307 |

FOREIGN PATENT DOCUMENTS

| | | | |
|---|---|---|---|
| EP | 1803830 A1 | 5/2000 | |
| EP | 1988190 A2 | 11/2008 | |
| EP | 2008743 A1 | 12/2008 | |
| JP | H11-197936 A | 7/1999 | |
| JP | 2004-315903 A | 11/2004 | |
| JP | 2004-315904 | * 11/2004 | |
| JP | 2009-120903 A | 6/2009 | |
| WO | 2010002344 A1 | 1/2010 | |

* cited by examiner

*Primary Examiner* — Archene Turner
(74) *Attorney, Agent, or Firm* — Corinne R. Gorski

(57) ABSTRACT

The present invention relates to a coated cutting tool comprising a PVD coating and a cemented carbide substrate comprising Co in an amount of 12.5-17 wt %, Cr in an amount such that the Cr/Co weight ratio is 0.05-0.15, a Ti of between 50 to 300 ppm by weight and a CW_Cr value between 0.8-0.97.

8 Claims, No Drawings

COATED CUTTING TOOL

RELATED APPLICATION DATA

This application is a §371 National Stage Application of PCT International Application No. PCT/EP2011/058957 filed May 31, 2011 claiming priority of European Application No. 10005853.6 filed Jun. 7, 2010 and U.S. Application No. 61/352,546 filed Jun. 8, 2010.

The present invention relates to a coated cutting tool suitable for milling in stainless steel. The coated cutting tool comprises a substrate and a PVD coating.

BACKGROUND

PVD coated cutting tools are well known in the art. PVD coatings usually have a high hardness and are desired for its high wear resistance, e.g. high resistance against flank and crater wear. However, such coatings can be brittle which can cause problems, such as flaking, when deposited onto substrates having a high toughness and also onto substrates having sharp geometries.

Cemented carbide substrates having a high toughness are typically cemented carbide having a high cobalt content. An increased cobalt content increases the toughness of the cemented carbide but also decreases the hardness. By applying a more fine-grained substrate, the hardness of the cemented carbide can be increased.

Fine grained cemented carbide substrates with PVD coatings are known in the art.

EP 1 803 830 A1 discloses a cemented carbide having a WC mean particle diameter less than 0.3 µm. This cemented carbide is particularly suitable for micro-drills used for printed circuit boards. EP 1 803 830 A1 does not disclose a coating.

WO 2010/002344 A1 discloses a cutting tool insert for turning of steels comprising a substrate and a coating where the substrate comprises WC, 8.5-11.5 wt-% Co, 0.8-1.2 wt-% Cr and a coercivity of 19-23 kA/m and a coating comprising an inner (Al,Ti)ON-layer and a (Al,Cr)O-layer.

However, cobalt contents above 12 wt % has still, in many applications, been considered to be too high to achieve a substrate having a high toughness but with enough hardness to be coated with a PVD-coating.

It is an object of the present invention to obtain a coated cutting tool having a hard coating deposited onto a substrate having a high toughness.

It is yet another object of the present invention to obtain a coated cutting tool that will increase the edge line toughness.

It has been found that the objectives above can be met by combining a PVD coating with a fine grained cemented carbide substrate having a cobalt content as high as 12.5-17 wt %, a Cr content such that the Cr/Co weight ratio is 0.05-0.15 and a Ti content of between 50 to 300 ppm by weight.

DETAILED DESCRIPTION OF THE INVENTION

The present invention relates to a coated cutting tool suitable for milling stainless steel comprising a cemented carbide substrate and a PVD coating. The cemented carbide substrate comprises WC, Co in an amount of between 12.5-17 wt %, Cr in an amount such that the Cr/Co weight ratio is 0.05-0.15 and Ti in an amount of between 50 to 300 ppm by weight.

The cobalt content is suitably between 12.5-17.0 wt %, preferably between 13-16 wt %, most preferably between 13.3-15.5 wt %. The Cr content is suitably such that the Cr/Co weight ratio is 0.05-0.15, preferably 0.08-0.12 and most preferably 0.09-0.11.

The Ti content is suitably between 50 to 300 ppm by weight, preferably between 50 to 250 ppm by weight, more preferably between 100 to 175 ppm by weight. The coercivity is suitably between 13 and 20 kA/m and preferably between 15.5 and 19 kA/m.

The Co binder phase is alloyed with W and Cr which influences the magnetic properties of the binder phase and can hence be related to a value, CW_Cr ratio, defined as:

CW_Cr=(magnetic-% Co+1.13*wt-% Cr)/wt-% Co where magnetic-% Co is the weight percentage of magnetic Co, wt-% Cr is the weight percentage of Cr in the cemented carbide and wt-% Co is the weight percentage of Co in the cemented carbide. The CW_Cr-ratio is suitably 0.80-0.97, preferably 0.85-0.95.

A PVD coating is herein meant a coating deposited by PVD technique, e.g. cathodic arc evaporation, magnetron sputtering, high power pulsed magnetron sputtering (HPPMS), ion plating etc., preferably cathodic arc evaporation or magnetron sputtering. The PVD coating according to the present invention is characterized by having a hardness suitably between 20 and 50 GPa and comprising compressive stresses, as measured by XRD by using $\psi$-geometry on a X-ray diffractometer Bruker D8 Discover-GADDS equipped with laser-video positioning, Euler ¼-cradle, rotating anode as X-ray source ($CuK_\alpha$-radiation) and an area detector (Hi-star). A collimator of size 0.5 mm was used to focus the beam. The analysis was performed on the TiAlN (200) reflection using the goniometer settings $2\theta=50°$, $\omega=25°$ and $\Phi=0°, 90°, 180°, 270°$. Eight $\psi$ tilts between 0° and 70° were performed for each $\Phi$-angle. The $\sin^2\psi$ method was used to evaluate the residual stress using the software DIFFRAC$^{Plus}$ Stress32 v. 1.04 from Bruker AXS with the constants Young's modulus, E=480 GPa and Poisson's ratio, $\nu=0.20$ and locating the reflection using the Pseudo-Voigt-Fit function.

The PVD coating can be both a single homogenous coating or comprising several different layers having different thicknesses and different composition. The PVD coating can be a nitride, oxide or carbide or any mixture thereof.

In one embodiment of the present invention, the thickness of the PVD coating is suitably between 0.5-20 µm, preferably between 2 and 10 µm.

All thicknesses given herein refer to measurements conducted on a reasonably flat surface being in direct line of sight from the targets. For inserts, being mounted on sticks during deposition, it means that the thickness has been measured on the middle of a side directly facing the target. For irregular surfaces, such as those on e.g. drills and end mills, the thicknesses given herein refers to the thickness measured on any reasonably flat surface or a surface having a relatively large curvature and some distance away from any edge or corner. For instance, on a drill, the measurements have been performed on the periphery and on an end mill the measurements has been performed on the flank side.

In one embodiment of the present invention, the PVD coating comprises a homogenous nitride, carbide, oxide, boride or mixtures thereof, of one or more elements of groups IVb, Vb, VIb, Al, Y and Si. Suitably the coating is a homogenous nitride coating of one or more elements of groups IVb, Vb, VIb, Al, Y and Si, preferably one or more of Ti, Al, Si and Cr, most preferably Ti and Al.

In one embodiment of the present invention, the PVD coating comprises an aperiodic multilayer which comprises a multilayered structure A/B/A/B/A/B ... where the alternating sublayers A and B are being repeated throughout the entire coating and where the composition of A and B are different from each other. The sublayers A and B are suitably nitrides of one or more elements of groups IVb, Vb, VIb, Al, Y and Si, preferably or more elements of Ti, Al, Si and Cr more preferably Ti and/or Al. By aperiodic it is understood that the thickness of a particular individual layer in the multilayered structure has no relation to the thickness of an individual layer immediately beneath, nor above the particular individual layer. The multilayered structure does not have any repeat period in the sequence of at least 10 consecutive individual layers. By multilayered structure is herein meant a structure comprising at least 5 individual layers. However, it can comprise up to several thousand individual layers.

The composition of each individual layer in the multilayered structure cannot easily be measured without contribution from adjacent layers due to the low thickness. What can be measured is the average composition over the whole multilayer structure. However, the composition of each individual layer can be estimated from the composition of the targets used but that does not give an exact composition. When thicker layers have been deposited, thick enough to be analysed, it has been shown that the composition of the deposited layers can differ with a few percent compared to the composition of the target material. Due to this fact, any composition of the individual layers of the multilayered structure according to the present invention mentioned herein after is estimations from the compositions of the targets used during the deposition.

The thickness of any individual layer in an aperiodic multilayered structure is larger than 1 nm but smaller than 100 nm, preferably larger than 2 nm but smaller than 50 nm, most preferably larger than 3 nm but smaller than 30 nm. The sum of any ten consecutive layers in the multilayered structure is smaller than 300 nm.

In one embodiment of the present invention, the coating comprises at least two, preferably at least five, aperiodic multilayered structures varying TiN and (Ti,Al)N layers wherein the aperiodic multilayered structures are repeatedly alternated with (Ti,Al)N homogeneous layers. The composition of the homogenous layers is $(Ti_yAl_{1-y})N$ where $0.35<y<0.65$, preferably $0.40<y<0.60$ and the average composition of the multilayered structure is $(Ti_zAl_{1-z})N$ where $0.50<z<0.90$, preferably $0.70<z<0.90$. The coating suitably has a thickness of between 3-6 µm, preferably 3.5-4.5 µm.

In another embodiment of the present invention, the coating comprises an aperiodic multilayer which comprises a multilayered structure of the form A/B/A/B/A/B . . . where the sublayer A is TiN and layer B is a $(Ti_mAl_{1-m})N$ layer where m suitably is between 0.1 to 0.7, preferably between 0.3 to 0.6 and most preferably between 0.4 to 0.6 resulting in a coating with average composition $(Ti_{1-z}Al_z)N$ where z is suitably 0.05 to 0.35, preferably between 0.10 to 0.3 and most preferably 0.12 to 0.25 as measured by EDS. The coating suitably has a thickness of between 3-6 µm, preferably 3.5-4.5 µm.

In another embodiment of the present invention, the coating comprises a periodic multilayer which comprises a multilayered structure of the form A/B/A/B/A/B . . . the sublayer A is a nitride of a $(Ti_xAl_{1-x})N$ layer, where x is 0.25-0.40, preferably 0.3-0.35. Layer B comprises of $(Ti_yAl_{1-y})N$, where y is 0.6-1, preferably 0.75-1. The (Ti,Al)N coating will then have an average composition $(Ti_{1-z}Al_z)N$ where z suitably is between 0.3-0.8, preferably 0.4 to 0.6 as measured by EDS. The coating suitably has a thickness of between 2-7 µm, preferably 3-5 µm.

In another embodiment of the present invention, the PVD coating comprises an inner (Ti,Al)N layer and an outer (Al, Cr)O-layer. In one embodiment, the inner (Ti,Al)N layer is a homogenous (Ti,Al)N layer. In another embodiment, the inner (Ti,Al)N layer have an aperiodic multilayered structure comprising alternating layers of $(Al_zTi_{1-z})N$ and $(Al_vTi_{1-v})N$, where $z \neq v$. The compositions of the alternating layers are preferably z=0.1-0.4, most preferably z=0.20-0.30, and preferably v=0.50-0.70, most preferably v=0.6-0.7. The average composition of the aperiodic, multilayered structure is $(Al_yTi_{1-y})N$, where y=0.2-0.6, preferably 0.4-0.5 as measured by EDS.

The (Al,Cr)O-layer suitably have a composition of $(Al_xCr_{1-x})_2O_3$, where x=0.5-0.9, preferably x=0.6-0.8. The (Al,Cr)O-layer suitably have a thickness of 0.2-10 µm, preferably 0.4-4 µm, The total coating suitably has a thickness of between 1.5-11 µm, preferably 2 to 7 µm.

In one embodiment of the present invention, the cutting tool comprises a substrate having a Co content of suitably between 13-14.5 wt %, preferably between 13.3 to 14 wt %, a Cr content such that the Cr/Co weight ratio is 0.09-0.11, a Ti content of between 100 to 175 ppm by weight and a coercivity suitably between 16 and 19 kA/m, preferably between 16.5 to 18.9 kA/m and most preferably between 17 to 18 kA/m. Further, the cutting tool comprises a PVD coating being a homogenous $(Al_zTi_{1-z})N$ where z is between 0.6-0.7. The CW_Cr-ratio is suitably 0.85-0.95.

The cutting tool can be in the shape of an insert, an endmill or a drill.

Example 1 (Invention)

Cemented carbide blanks were pressed in a 45 degree milling insert geometry from a cemented carbide powder consisting of 13.5 wt-% Co, 1.35 wt-% Cr, 0.015 wt-% Ti and balance WC and sintered at a temperature of 1410 degrees C. giving inserts with a coercivity value of 17.7 kA/m, measured using a Foerster Koerzimat CS 1.096 according to DIN IEC 60404-7, and a magnetic-% Co value of 10.38. The inserts were periphery ground and edge rounded using a wet blasting method to a cutting edge radius of 15 µm and coated with a PVD coating.

The coating was deposited by PVD by arc evaporation using TiAl and AlCr metal targets. The coating consisting of an inner layer TiAlN where the mentioned inner layer is an aperiodic multilayer made from $Al_{0.67}Ti_{0.33}$ and $Al_{0.25}Ti_{0.75}$ targets in a nitrogen environment and an outer layer of AlCrO made from $Al_{0.7}Cr_{0.3}$ targets in an oxygen environment.

Example 2 (Invention)

Cemented carbide blanks were pressed in 45 degree milling insert geometry from the same cemented carbide powder as in Example 1 and sintered the same way as in Example 1 and having the same coercivity and magnetic-% Co values.

The inserts were periphery ground and edge rounded using a wet blasting method to a cutting edge radius of 15 µm and coated with a PVD coating different from that in Example 1.

The coating was deposited by PVD using arc evaporation using TiAl metal targets. The coating consisting of a single layer with the composition $Al_{0.67}Ti_{0.33}N$ Example 3 (Invention)

Cemented carbide blanks were pressed in a 45 degree milling insert geometry from a cemented carbide powder consisting of 15 wt-% Co, 1.5 wt-% Cr, 0.015 wt-% Ti and balance WC and sintered as in Example 1 and Example 2 giving inserts with a coercivity value of 15.95 kA/m and a magnetic-% Co value of 11.47. The inserts were periphery ground and edge rounded using a wet blasting method to a cutting edge radius of 15 μm and coated with a PVD coating different from that in Example 1 and Example 2.

The coating was deposited by PVD using arc evaporation using TiAl metal targets. The coating consisting of a multilayer alternating TiN and $(Ti_{0.50}Al_{0.50})N$ layers.

Example 4 (Prior Art)

Cemented carbide blanks were pressed in a 45 degree milling insert geometry from a cemented carbide powder consisting of 10 wt-% Co, 1.0 wt-% Cr, 0.01 wt-% Ti, 0.01 wt-% Ta and balance WC and sintered as in Example 1 and Example 2 giving inserts with a coercivity value of 20.95 kA/m and a magnetic-% Co value of 7.74. The inserts were periphery ground and edge rounded using a wet blasting method to a cutting edge radius of 15 μm and coated with a PVD coating where the coating was deposited with a coating process according to Example 1.

Example 5

The produced inserts of 45 degree milling geometry were tested in a face milling operation, using a milling cutter of diameter 80 mm in stainless steel, SS2343-28 PRODEC (PRODEC 316L):
Cutting Data:
 Cutting speed: 80 m/min
 Feed per tooth: 0.24 mm
 Width of cut ($a_e$): 66 mm
 Axial depth of cut: 2 mm
 Coolant: Yes
Each variant was tested in two trials and Table 1 shows the average results of the two trials. The tool life determining wear was edge line breakage or chipping.

TABLE 1

| Insert | Tool life, Machined length (m) |
|---|---|
| Ex. 1 (invention) | 2.5 |
| Ex. 2 (invention) | 2.0 |
| Ex. 4 (prior art) | 1.5 |

Example 6

The inserts according to Example 1 and Example 3 were tested in the same application during the same cutting conditions as described in Example 5.

Each variant was tested in two trials and Table 2 shows the average results of the two trials. The tool life determining wear was edge line breakage or chipping.

TABLE 2

| Insert | Tool life, Machined length (m) |
|---|---|
| Ex. 3 (invention) | 2.6 |
| Ex. 4 (prior art) | 1.7 |

The invention claimed is:
1. A cutting tool comprising:
 a substrate; and
 a PVD coating disposed on the substrate, wherein the substrate comprises WC, Co in an amount of between 12.5-17 wt %, Cr in an amount such that the Cr/Co weight ratio is 0.05-0.15, and a Ti content of between 50 to 300 ppm by weight.
2. A cutting tool according to claim 1, wherein the cemented carbide substrate has a CW—Cr ration of between 0.80-0.97 and a coercivity of between 13 and 20 kA/m.
3. A cutting tool according to claim 1, wherein the Co content is 13-16 wt %, the Cr content such that the Cr/Co weight ratio is 0.08-0.12, and the Ti content of between 50 to 250 ppm.
4. A cutting tool according to claim 1, wherein the PVD coating is a homogenous PVD coating.
5. A cutting tool according to claim 1, wherein the PVD coating is a homogenous nitride coating of one or more of the elements from the group of IVb, Vb, VIb, Al, Y and Si.
6. A cutting tool according claim 1, wherein the PVD coating is a homogenous nitride coating of the elements Ti and Al.
7. A cutting tool comprising:
 a substrate comprising WC; Co in an amount of between 12.5-17 wt %; Cr in an amount such that the Cr/Co weight ratio is 0.05-0.15; and a Ti content of between 50 to 300 ppm by weight; and
 a PVD coating comprising an aperiodic multilayered structure of alternating sublayers A/B/A/B/A/B . . . , wherein the alternating sublayers A and B are repeated throughout the entire coating and wherein the composition of A and B are different from each other and wherein the sublayers A and B are nitrides of one or more elements from the group of IVb, Vb, VIb, Al, Y and Si.
8. A cutting tool according to claim 7, wherein the PVD coating comprises a multilayered structure of alternating sublayers A and B of Ti and/or Al.

* * * * *